United States Patent
Hoshi et al.

(10) Patent No.: US 9,611,541 B2
(45) Date of Patent: Apr. 4, 2017

(54) FORMED ARTICLE, METHOD FOR PRODUCING SAME, ELECTRONIC DEVICE MEMBER, AND ELECTRONIC DEVICE

(75) Inventors: Shinichi Hoshi, Tokyo (JP); Takeshi Kondo, Tokyo (JP); Kazue Uemura, Tokyo (JP); Yuta Suzuki, Tokyo (JP)

(73) Assignee: LINTEC CORPORATION, Tokyo (JP)

( * ) Notice: Subject to any disclaimer, the term of this patent is extended or adjusted under 35 U.S.C. 154(b) by 1023 days.

(21) Appl. No.: 13/138,499

(22) PCT Filed: Mar. 24, 2010

(86) PCT No.: PCT/JP2010/055065
§ 371 (c)(1),
(2), (4) Date: Nov. 28, 2011

(87) PCT Pub. No.: WO2010/110305
PCT Pub. Date: Sep. 30, 2010

(65) Prior Publication Data
US 2012/0088880 A1    Apr. 12, 2012

(30) Foreign Application Priority Data
Mar. 26, 2009  (JP) ................. 2009-075947

(51) Int. Cl.
C23C 14/14 (2006.01)
C23C 14/48 (2006.01)
(Continued)

(52) U.S. Cl.
CPC ............ *C23C 14/48* (2013.01); *C23C 14/562* (2013.01); *B05D 1/62* (2013.01); *B05D 3/148* (2013.01); *B05D 2252/02* (2013.01)

(58) Field of Classification Search
CPC ............... C23C 14/48; C23C 14/0605
(Continued)

(56) References Cited

U.S. PATENT DOCUMENTS

| 5,098,202 A * | 3/1992 | Rosenbaum ................. 383/67 |
| 5,190,807 A * | 3/1993 | Kimock et al. ............ 428/216 |
| 2008/0196664 A1* | 8/2008 | David ............... H01L 51/5237 118/623 |

FOREIGN PATENT DOCUMENTS

| EP | 1 055 745 A1 | 11/2000 |
| EP | 2 397 324 A1 | 12/2011 |

(Continued)

OTHER PUBLICATIONS

Translated Abstract of HU 211184, retrieved on Jun. 11, 2014.*
(Continued)

*Primary Examiner* — Dah-Wei D Yuan
*Assistant Examiner* — Nga Leung V Law
(74) *Attorney, Agent, or Firm* — Birch, Stewart, Kolasch & Birch, LLP

(57) ABSTRACT

Disclosed is a formed article comprising a layer obtained by implanting ions of a hydrocarbon compound into a polyorganosiloxane compound-containing layer. Also disclosed are: a method of producing the formed article, the method comprising implanting ions of a hydrocarbon compound into a surface of a polyorganosiloxane compound-containing layer of a formed body that includes the polyorganosiloxane compound-containing layer in its surface; an electronic device member that includes the formed article; and an electronic device that includes the electronic device member. The present invention provides; a formed article which exhibits an excellent gas barrier capability, transparency, bendability, antistatic performance, and surface flatness; a method of producing the formed article, an electronic device member, and an electronic device.

5 Claims, 2 Drawing Sheets

(51) Int. Cl.
*C23C 14/56* (2006.01)
*B05D 1/00* (2006.01)
*B05D 3/14* (2006.01)

(58) Field of Classification Search
USPC .................................... 427/523, 525, 527
See application file for complete search history.

(56) References Cited

FOREIGN PATENT DOCUMENTS

| HU | 211 184 | * | 2/1993 |
| JP | 6-344495 A | | 12/1994 |
| JP | 2001-192826 A | | 7/2001 |
| JP | 2005-048252 A | | 2/2005 |
| JP | 2006-070238 A | | 3/2006 |
| JP | 2006070238 A | * | 3/2006 |
| JP | 2006-297737 A | | 11/2006 |
| JP | 2007-283726 A | | 11/2007 |
| JP | 2007283726 A | * | 11/2007 |

OTHER PUBLICATIONS

Supplemental European Search Report dated Jan. 21, 2014, issued in European Patent Application No. 10756101.1.
International Search Report, PCT/JP2010/055065, Apr. 27, 2010.

\* cited by examiner (a)

(b)

FORMED ARTICLE, METHOD FOR PRODUCING SAME, ELECTRONIC DEVICE MEMBER, AND ELECTRONIC DEVICE

TECHNICAL FIELD

The invention relates to a formed article that exhibits an excellent gas barrier capability, transparency, bendability, antistatic performance, and surface flatness, a method of producing the same, an electronic device member that includes the formed article, and an electronic device that includes the electronic device member.

BACKGROUND ART

A polymer formed article (e.g., plastic film) that is inexpensive and exhibits excellent workability has been provided with a desired function, and used in various fields.

In recent years, use of a transparent plastic film as a substrate instead of a glass plate has been proposed for displays (e.g., liquid crystal display and electroluminescence (EL) display) in order to implement a reduction in thickness, a reduction in weight, an increase in flexibility, and the like.

For example, Patent Document 1 discloses a gas barrier film in which a gas barrier layer formed of an inorganic compound is formed on a transparent plastic film. When using the gas barrier film disclosed in Patent Document 1, however, a pinhole may be formed in the inorganic compound thin film, so that the gas barrier capability significantly decreases in an area around the pinhole. Moreover, cracks may occur in the gas barrier layer when the film is rolled or folded, so that the gas barrier capability decreases. The gas barrier film disclosed in Patent Document 1 also has a problem in that a pinhole is easily formed in an additional layer formed on the gas barrier layer due to insufficient surface flatness. Therefore, the gas barrier film cannot be reliably used for an electronic device member.

Patent Document 2 discloses a gas barrier film in which an amorphous diamond-like carbon film is formed on a plastic base. However, the gas barrier film disclosed in Patent Document 2 may not be suitable for displays and the like due to low transparency.

Patent Document 3 discloses a formed article that includes a cured layer of an ionizing radiation-curable resin composition and a diamond-like carbon film. Patent Document 3 discloses forming the diamond-like carbon film on the cured layer by plasma ion implantation method.

A formed article obtained by the method disclosed in Patent Document 3 exhibits excellent water vapor resistance, but exhibits an insufficient gas barrier capability.

RELATED-ART DOCUMENT

Patent Document

Patent Document 1: JP-A-2006-297737
Patent Document 2: JP-A-6-344495
Patent Document 3: JP-A-2007-283726

SUMMARY OF THE INVENTION

Problems to be Solved by the Invention

The invention was conceived in view of the above situation. An object of the invention is to provide a formed article that exhibits an excellent gas barrier capability, transparency, bendability, antistatic performance, and surface flatness, a method of producing the same, an electronic device member that includes the formed article, and an electronic device that includes the electronic device member.

Means for Solving the Problems

The inventors of the invention conducted extensive studies to achieve the above object. As a result, the inventors found that the target formed article can be conveniently and efficiently produced by implanting ions of a hydrocarbon compound into a surface of a polyorganosiloxane compound-containing layer of a formed body that includes the polyorganosiloxane compound-containing layer in its surface. This finding has led to the completion of the invention.

A first aspect of the invention provides the following formed article (see (1) to (3)).

(1) A formed article including a layer obtained by implanting ions of a hydrocarbon compound into a polyorganosiloxane compound-containing layer.
(2) The formed article according to (1), wherein the layer is obtained by implanting ions of the hydrocarbon compound into the polyorganosiloxane compound-containing layer by plasma ion implantation method.
(3) The formed article according to (1) or (2), the formed article having a water vapor transmission rate at a temperature of 40° C. and a relative humidity of 90% of 1.5 $g/m^2/day$ or less.

A second aspect of the present invention provides the following method of producing a formed article (see (4) and (5)).

(4) A method of producing the formed article according to (1), the method including implanting ions of a hydrocarbon compound into a surface of a polyorganosiloxane compound-containing layer of a formed body that includes the polyorganosiloxane compound-containing layer in its surface.
(5) The method according to (4), including implanting ions of the hydrocarbon compound into a polyorganosiloxane compound-containing layer while carrying a long formed body that includes the polyorganosiloxane compound-containing layer in its surface in a given direction.

A third aspect of the invention provides the following electronic device member (see (6)).
(6) An electronic device member including the formed article according to any one of (1) to (3).

A fourth aspect of the invention provides the following electronic device (see (7)).
(7) An electronic device including the electronic device member according to (6).

Effects of the Invention

The above formed article exhibits an excellent gas barrier capability, transparency, bendability, antistatic performance, and surface flatness. Therefore, the formed article may suitably be used as an electronic device member for flexible displays, solar batteries, and the like.

The above formed article may be easily and efficiently produced by the above method.

Since the above electronic device member exhibits an excellent gas barrier capability, excellent transparency, and the like, the electronic device member may suitably be used for electronic devices such as displays and solar batteries.

DESCRIPTION OF EXEMPLARY EMBODIMENTS

Figure 1:
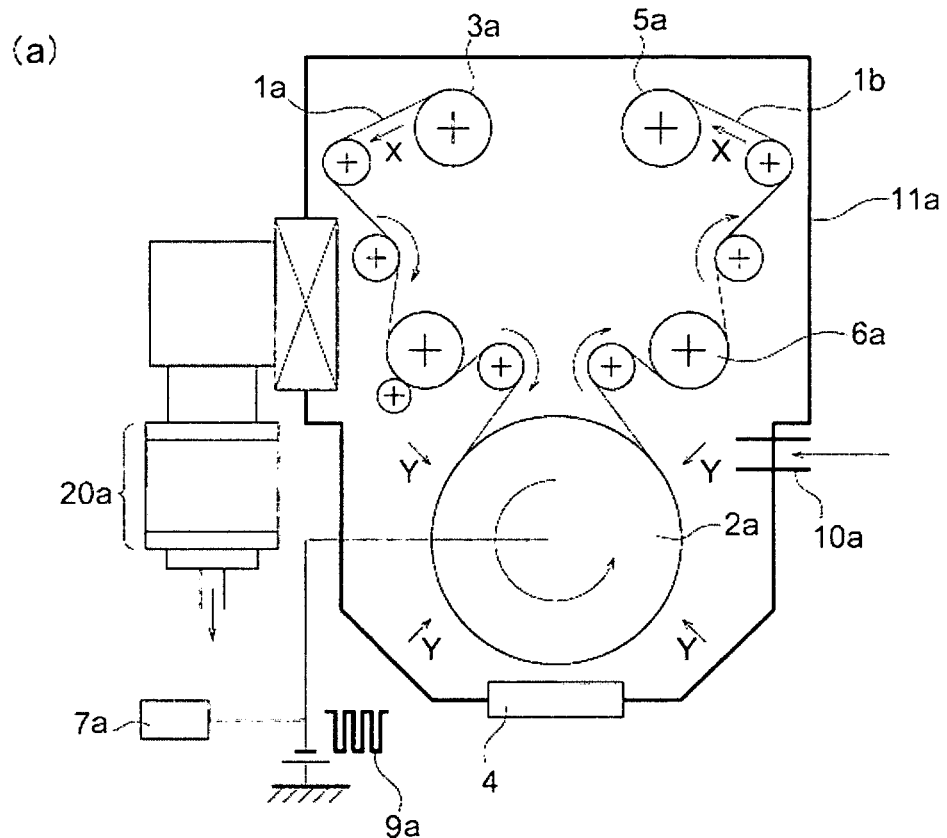
FIG. 1 is a view showing a schematic configuration of a plasma ion implantation apparatus.
Figure 1:
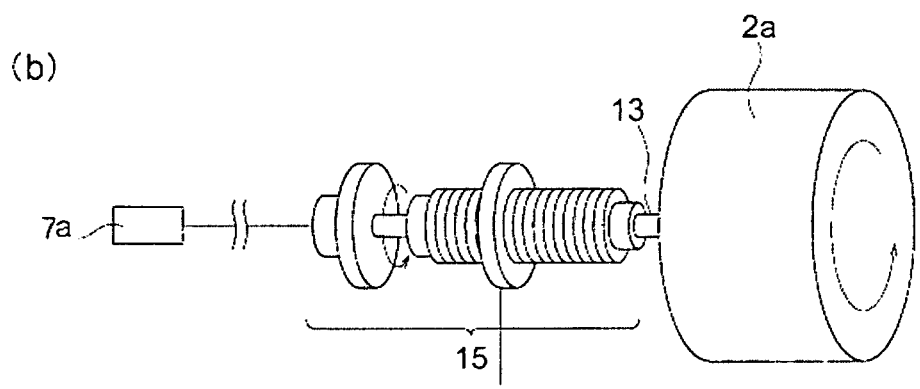

A formed article, a method of producing a formed article, an electronic device member, and an electronic device according to embodiments of the invention are described in detail in below.

1) Formed Article

A formed article according to one embodiment of the invention includes a layer (hereinafter referred to as "ion-implanted layer") obtained by implanting ions of a hydrocarbon compound into a polyorganosiloxane compound-containing layer (hereinafter may be referred to as "polyorganosiloxane compound layer").

Note that the term "polyorganosiloxane compound" refers to a silicon-containing polymer compound that includes a repeating unit including a siloxane bond (—(O—Si)—O—).

The main chain structure of the polyorganosiloxane compound is not particularly limited. The main chain structure of the polyorganosiloxane compound may be linear, ladder-like, or polyhedral.

Examples of the linear main chain structure of the polyorganosiloxane compound include a structure shown by the following formula (a). Examples of the ladder-like main chain structure of the polyorganosiloxane compound include a structure shown by the following formula (b). Examples of the polyhedral main chain structure of the polyorganosiloxane compound include a structure shown by the following formula (c).

wherein Rx, Ry, and Rz individually represent a hydrogen atom, a non-hydrolysable group such as a substituted or unsubstituted alkyl group, a substituted or unsubstituted alkenyl group or a substituted or unsubstituted aryl group, provided that a case where both Rx in the formula (a) represent a hydrogen atom is excluded. Note that a plurality of Rx in the formula (a), a plurality of Ry in the formula (b), and a plurality of Rz in the formula (c) may respectively be either the same or different.

Examples of the substituted or unsubstituted alkyl group include alkyl groups having 1 to 10 carbon atoms (e.g., methyl group, ethyl group, n-propyl group, isopropyl group, n-butyl group, isobutyl group, sec-butyl group, t-butyl group, n-pentyl group, isopentyl group, neopentyl group, n-hexyl group, n-heptyl group, and n-octyl group).

Examples of the alkenyl group include alkenyl groups having 2 to 10 carbon atoms (e.g., vinyl group, 1-propenyl group, 2-propenyl group, 1-butenyl group, 2-butenyl group, and 3-butenyl group).

Examples of a substituent for the alkyl group and the alkenyl group include halogen atoms such as a fluorine atom, a chlorine atom, a bromine atom, and an iodine atom; a hydroxyl group; a thiol group; an epoxy group; a glycidoxy group; a (meth)acryloyloxy group; substituted or unsubstituted phenyl groups such as a phenyl group, a 4-methylphenyl group, and a 4-chlorophenyl group; and the like.

Examples of the aryl group include aryl groups having 6 to 10 carbon atoms (e.g., phenyl group, 1-naphthyl group, and 2-naphthyl group).

Examples of a substituent for the aryl group include halogen atoms such as a fluorine atom, a chlorine atom, a

[Chemical Formula 1]

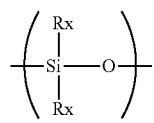

(a)

[Chemical Formula 2]

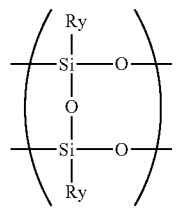

(b)

[Chemical Formula 3]

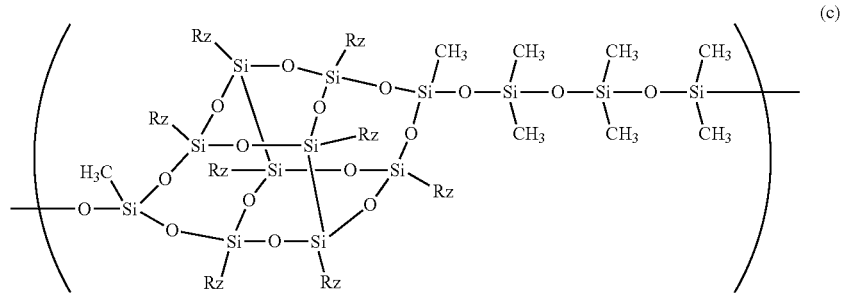

(c)

bromine atom, and an iodine atom; alkyl groups having 1 to 6 carbon atoms, such as a methyl group and an ethyl group; alkoxy groups having 1 to 6 carbon atoms, such as a methoxy group and an ethoxy group; a nitro group; a cyano group; a hydroxyl group; a thiol group; an epoxy group; a glycidoxy group; a (meth)acryloyloxy group; substituted or unsubstituted aryl groups such as a phenyl group, a 4-methylphenyl group, and a 4-chlorophenyl group; and the like.

Among these, a hydrogen atom, an alkyl group having 1 to 6 carbon atoms, or a phenyl group is preferable as Rx, Ry, and Rz. An alkyl group having 1 to 6 carbon atoms is particularly preferable as Rx, Ry, and Rz.

The polyorganosiloxane compound is preferably a linear compound shown by the formula (a) or a ladder-like compound shown by the formula (b), more preferably a linear compound shown by the formula (a), and particularly preferably a polydimethylsiloxane shown by the formula (a) in which both Rx represent a methyl group, from the viewpoint of availability and a capability to form an ion-implanted layer that exhibits an excellent gas barrier capability.

The polyorganosiloxane compound may be produced by a known method that polycondenses a silane compound including a hydrolysable functional group.

The silane compound including a hydrolysable functional group may be appropriately selected depending on the structure of the target polyorganosiloxane compound. Specific examples of a preferable silane compound including a hydrolysable functional group include bifunctional silane compounds such as dimethyldimethoxysilane, dimethyldiethoxysilane, diethyldimethoxysilane, and diethyldiethoxysilane; trifunctional silane compounds such as methyltrimethoxysilane, methyltriethoxysilane, ethyltrimethoxysilane, ethyltriethoxysilane, n-propyltrimethoxysilane, n-butyltriethoxysilane, phenyltrimethoxysilane, phenyltriethoxysilane, and phenyldiethoxymethoxysilane; tetrafunctional silane compounds such as tetramethoxysilane, tetraethoxysilane, tetra-n-propoxysilane, tetraisopropoxysilane, tetra-n-butoxysilane, tetra-t-butoxysilane, tetra-s-butoxysilane, methoxytriethoxysilane, dimethoxydiethoxysilane, and trimethoxyethoxysilane; and the like.

A product commercially available as a release agent, an adhesive, a sealant, a paint, or the like as is may be used as the polyorganosiloxane compound.

The polyorganosiloxane compound layer may include a component other than the polyorganosiloxane compound insofar as the object of the present invention is not impaired. Examples of a component other than the polysilazane compound include a curing agent, another polymer, an aging preventive, a light stabilizer, a flame retardant, and the like.

The content of the polyorganosiloxane compound in the polyorganosiloxane compound layer is preferably 50 wt % or more, and more preferably 70 wt % or more, from the viewpoint of obtaining an ion-implanted layer that exhibits an excellent gas barrier capability.

The polyorganosiloxane compound layer may be formed by an arbitrary method. For example, the polyorganosiloxane compound layer may be formed by applying a polyorganosiloxane compound layer-forming composition that includes at least one polyorganosiloxane compound, an optional component, a solvent, and the like to an appropriate base, drying the resulting film, and optionally heating the dried film. The base may be a film formed of a material that forms an additional layer described later.

The thickness of the polyorganosiloxane compound layer is not particularly limited, but is normally 30 nm to 100 μm.

The ion-implanted layer is obtained by implanting ions of a hydrocarbon compound (hereinafter may be referred to as "ions") into the polyorganosiloxane compound layer.

Examples of a raw material gas that produces ions of the hydrocarbon compound include an alkane gas such as methane, ethane, propane, butane, pentane, and hexane; an alkene gas such as ethylene, propylene, butene, and pentene; an alkadiene gas such as pentadiene and butadiene; an alkyne gas such as acetylene and methylacetylene; an aromatic hydrocarbon gas such as benzene, toluene, xylene, indene, naphthalene, and phenanthrene; a cycloalkane gas such as cyclopropane and cyclohexane; a cycloolefin gas such as cyclopentene and cyclohexene; and the like.

These gases may be used either individually or in combination.

Among these, a hydrocarbon compound gas having 1 to 3 carbon atoms is preferable, and methane gas, ethylene gas, and acetylene gas are particularly preferable since the target formed article can be more easily obtained.

The dose may be appropriately determined depending on the usage of the resulting formed article (e.g., gas barrier capability and transparency), and the like.

The ion implantation method is not particularly limited. A known method may be used. For example, ions may be implanted by applying ions (ion beams) accelerated by an electric field, implanting ions present in plasma, or the like. It is preferable to implant ions present in plasma (hereinafter referred to as "plasma ion implantation method") since a gas-barrier formed article can be easily obtained.

Plasma ion implantation method includes implanting ions present in plasma into the surface in the polyorganosiloxane compound layer by applying a negative high-voltage pulse to a formed body that is exposed to plasma and includes the polyorganosiloxane compound layer in its surface.

The thickness of the ion implantation area can be controlled by adjusting the implantation conditions, and may be appropriately determined depending on the application of the resulting formed article. The thickness of the ion implantation area is normally 0.1 to 1000 nm.

Whether or not an ion-implanted layer has been formed may be determined by performing elemental analysis in an area having a depth of about 10 nm from the surface by X-ray photoelectron spectroscopy (XPS).

The shape of the formed article according to one embodiment of the invention is not particularly limited. For example, the formed article may be in the shape of a film, a sheet, a rectangular parallelepiped, a polygonal prism, a tube, or the like. When using the formed article as an electronic device member (described later), the formed article is preferably in the shape of a film or a sheet. When the formed article is in the shape of a film, the thickness of the film is not particularly limited, and may be appropriately determined depending on the application of the resulting electronic device.

The formed article according to one embodiment of the invention may include only the ion-implanted layer, or may also include an additional layer other than the ion-implanted layer. The additional layer may be a single layer, or may include a plurality of identical or different layers. Examples of the additional layer include a base formed of a material other than the polyorganosiloxane compound.

The material that forms the additional layer is not particularly limited insofar as the application of the formed article is not hindered. Examples of the material for the additional layer include polyimides, polyamides, polyamideimides, polyphenylene ethers, polyether ketones, polyether ether ketones, polyolefins, polyesters, polycarbonates, polysulfones, polyether sulfones, polyphenylene sulfides, polyallylates, acrylic resins, cycloolefin polymers, aromatic polymers, and the like.

Among these, polyesters, polyamides, or cycloolefin polymers are preferable due to excellent transparency and versatility. It is more preferable to use polyesters or cycloolefin polymers.

Examples of the polyesters include polyethylene terephthalate, polybuthylene terephthalate, polyethylene naphthalate, polyallylate, and the like.

Examples of the polyamides include wholly aromatic polyamides, nylon 6, nylon 66, nylon copolymers, and the like.

Examples of the cycloolefin polymers include norbornene polymers, monocyclic olefin polymers, cyclic conjugated diene polymers, vinyl alicyclic hydrocarbon polymers, and hydrogenated products thereof. Specific examples of the cycloolefin polymers include Apel (ethylene-cycloolefin copolymer manufactured by Mitsui Chemicals Inc.), Arton (norbornene polymer manufactured by JSR Corporation), Zeonor (norbornene polymer manufactured by Zeon Corporation), and the like.

When the formed article according to one embodiment of the invention is a laminate that includes the additional layer, the ion-implanted layer may be situated at an arbitrary position, but preferably forms the surface layer of the formed article from the viewpoint of production efficiency and the like. When the ion-implanted layer forms the surface layer of the formed article, the ion-implanted layer may be formed on one side of the additional layer, or may be formed on each side of the additional layer.

The formed article according to one embodiment of the invention exhibits an excellent gas barrier capability, transparency, bendability, antistatic performance, and surface flatness.

The formed article according to one embodiment of the invention exhibits an excellent gas barrier capability since the formed article has a significantly low gas (e.g., water vapor) transmission rate as compared with the case where ions are not implanted into the formed body. For example, the water vapor transmission rate of the formed article at a temperature of 40° C. and a relative humidity of 90% (i.e., the amount of water vapor content that passes through the formed article (film) in a humidity-controlled room at a temperature of 40° C. and a relative humidity of 90%) is preferably 1.5 g/m$^2$/day or less.

The gas (e.g., water vapor) transmission rate of the formed article may be measured using a known gas transmission rate measuring apparatus.

The formed article according to one embodiment of the invention exhibits excellent transparency due to high visible light transmittance. The visible light transmittance (wavelength: 550 nm) of the formed article according to one embodiment of the invention is preferably 80% or more, and more preferably 85% or more. The visible light transmittance of the formed article may be measured using a known ultra violet visible near infra red (UV-VIS-NIR) spectrophotometer.

The formed article according to one embodiment of the invention exhibits excellent bendability. The formed article according to one embodiment of the invention exhibits excellent bendability since the formed article does not deteriorate (e.g., does not produce cracks) when the formed article is wound around a stainless steel rod, and rotated (reciprocated) ten times in the circumferential direction in a state in which the ion-implanted side is positioned on the outer side, for example.

The formed article according to one embodiment of the invention exhibits excellent antistatic performance. For example, when the formed article according to one embodiment of the invention is charged using a charge decay measuring apparatus, the formed article exhibits a short half-life (i.e., the time required for the initial static voltage to be reduced by 50%).

When measuring the surface resistivity of the formed article using a high resistivity meter, the formed article has low surface resistivity. The surface resistivity of the formed article according to one embodiment of the invention is normally $1.1 \times 10^{14}$ Ω/square or less, and preferably $1.0 \times 10^{10}$ to $1.05 \times 10^{14}$ Ω/square.

The formed article according to one embodiment of the invention also exhibits excellent surface flatness. The surface roughness Ra (nm) (measurement area: 1×1 μm or 25×25 μm) of the formed article according to one embodiment of the invention may be measured using an atomic force microscope (AFM). The surface roughness Ra of the formed article when the measurement area is 1×1 μm is preferably 0.35 nm or less, and more preferably 0.3 nm or less, and the surface roughness Ra of the formed article when the measurement area is 25×25 μm is preferably 3 nm or less, and more preferably 2.3 nm or less.

2) Method of Producing Formed Article

A method of producing a formed article according to one embodiment of the invention includes implanting ions of a hydrocarbon compound into a polyorganosiloxane compound layer of a formed body that includes the polyorganosiloxane compound layer in its surface.

Examples of the ions of the hydrocarbon compound include those mentioned above in connection with the formed article.

In the method of producing a formed article according to one embodiment of the invention, it is preferable to implant ions of a hydrocarbon compound into a polyorganosiloxane compound layer while carrying a long formed body that includes the polyorganosiloxane compound layer in its surface in a given direction. According to this configuration, ions can be implanted into a long formed body would around a feed roll while carrying the formed body in a given direction, which can then be wound around a wind-up roll, for example. Therefore, an ion-implanted formed article can be continuously produced.

The long formed body is in the shape of a film. The formed article may include only the polyorganosiloxane compound layer, or may also include an additional layer other than the polyorganosiloxane compound layer. Examples of the additional layer include a base formed of a material other than the polyorganosiloxane compound. The additional layer mentioned above may be used.

The thickness of the formed body is preferably 1 to 500 μm, and more preferably 5 to 300 μm, from the viewpoint of operability of winding/unwinding and feeding.

Ions may be implanted into the polyorganosiloxane compound layer by an arbitrary method. It is preferable to form an ion-implanted layer in the surface of the polyorganosiloxane compound layer by plasma ion implantation method.

Plasma ion implantation may be implemented by generating plasma is an atmosphere containing a hydrocarbon compound gas, and implanting ions of the hydrocarbon compound generated by applying a negative high-voltage pulse to the polyorganosiloxane compound layer into the surface of the polyorganosiloxane compound layer, for example.

As the plasma ion implantation method, it is preferable to use (A) a method that implants ions present in plasma generated by utilizing an external electric field into the surface of the polyorganosiloxane compound layer, or (B) a method that implants ions present in plasma generated due to an electric field produced by applying a negative high-voltage pulse to the polyorganosiloxane compound layer into the surface of the polyorganosiloxane compound layer.

When using the method (A), it is preferable to set the ion implantation pressure (plasma ion implantation pressure) to 0.01 to 1 Pa. If the plasma ion implantation pressure is within the above range, a uniform ion-implanted layer can be formed conveniently and efficiently. This makes it possible to efficiently form an ion-implanted layer that exhibits transparency and a gas barrier capability.

The method (B) does not require increasing the degree of decompression, allows an easy operation, and significantly reduces the processing time. Moreover, the entire polyorganosiloxane compound layer can be uniformly processed, and ions present in plasma can be continuously implanted into the surface of the polyorganosiloxane compound layer with high energy when applying a negative high-voltage pulse. The method (B) also has an advantage in that an ion-implanted layer can be uniformly formed in the surface of the polyorganosiloxane compound layer by merely applying a negative high-voltage pulse to the polyorganosiloxane compound layer without requiring a special means such as a high-frequency electric power supply (e.g., radio frequency (RF) power supply or microwave power supply).

When using the method (A) or (B), the pulse width when applying a negative high-voltage pulse (i.e., during ion implantation) is preferably 1 to 15 µs. If the pulse width is within the above range, a transparent and uniform ion-implanted layer can be formed more conveniently and efficiently.

The voltage applied when generating plasma is preferably −1 to −50 kV, more preferably −1 to −30 kV, and particularly preferably −5 to −20 kV. If the applied voltage is higher than −1 kV, the dose may be insufficient, so that the desired performance may not be obtained. If the applied voltage is lower than −50 kV, the formed article may be charged during ion implantation, or the formed article may be colored.

A plasma ion implantation apparatus is used when implanting ions present in the plasma into the surface of the polyorganosiloxane compound layer.

Specific examples of the plasma ion implantation apparatus include (α) an apparatus that causes the polyorganosiloxane compound layer (hereinafter may be referred to as "ion implantation target layer") to be evenly enclosed by plasma by superimposing high-frequency electric power on a feed-through that applies a negative high-voltage pulse to the ion implantation target layer so that ions present in plasma are attracted, implanted, made to collide, and deposited (JP-A-2001-26887), (β) an apparatus that includes an antenna in a chamber, wherein high-frequency electric power is applied to generate plasma, positive and negative pulses are alternately applied to the ion implantation target layer after plasma has reached an area around the ion implantation target layer, so that ions present in plasma are attracted and implanted by heating the ion implantation target layer by causing electrons present in plasma to be attracted and collide due to the positive pulse, and applying the negative pulse while controlling the temperature by controlling the pulse factor (JP-A-2001-156013), (γ) a plasma ion implantation apparatus that generates plasma using an external electric field (e.g., microwave high-frequency electric power supply), and causes ions present in plasma to be attracted and implanted by applying a high-voltage pulse, (δ) a plasma ion implantation apparatus that implants ions present in plasma generated due to an electric field produced by applying a high-voltage pulse without using an external electric field, and the like.

It is preferable to use the plasma ion implantation apparatus (γ) or (δ) since the plasma ion implantation apparatus (γ) or (δ) allows a convenient operation, significantly reduces the processing time, and can be continuously used.

A method using the plasma ion implantation apparatus (γ) or (δ) is described in detail below with reference to the drawings.

FIG. 1 is a view schematically showing a continuous plasma ion implantation apparatus that includes the plasma ion implantation apparatus (γ).

In FIG. 1(a), reference sign 1a indicates a long film-shaped formed body (hereinafter referred to as "film") that includes a polyorganosiloxane compound layer in its surface, reference sign 11a indicates a chamber, reference sign 20a indicates a turbo-molecular pump, reference sign 3a indicates a feed out roll around which the film 1a is wound before ion implantation, reference sign 5a indicates a wind-up roll around which an ion-implanted film (formed article) 1b is wound, reference sign 2a indicates a high-voltage rotary can, reference sign 6a indicates a driving roll, reference sign 10a indicates a gas inlet, reference sign 7a indicates a high-voltage pulse power supply, and reference sign 4 indicates a plasma discharge electrode (external electric field). FIG. 1(b) is a perspective view showing the high-voltage rotary can 2a, wherein reference numeral 15 indicates a high-voltage application terminal (feed-through).

The long film 1a that includes a polyorganosiloxane compound layer in its surface is a film in which a polyorganosiloxane compound layer is formed on a base (or additional layer).

In the continuous plasma ion implantation apparatus shown in FIG. 1, the film 1a is carried from the feed out roll 3a in an arrow direction X inside the chamber 11a, passes through the high-voltage rotary can 2a, and is wound around the wind-up roll 5a. The film 1a may be wound and carried by an arbitrary method. In one embodiment, the film 1a is carried by rotating the high-voltage rotary can 2a at a constant speed. The high-voltage rotary can 2a is rotated by rotating a center shaft 13 of the high-voltage application terminal 15 using a motor.

The high-voltage application terminal 15, the driving rolls 6a that come in contact with the film 1a, and the like are formed of an insulator. For example, the high-voltage application terminal 15, the driving rolls 6a, and the like are formed by coating the surface of alumina with a resin (e.g., polytetrafluoroethylene). The high-voltage rotary can 2a is formed of a conductor (e.g., stainless steel).

The carrying speed of the film 1a may be appropriately set. The carrying speed of the film 1a is not particularly limited insofar as ions are implanted into the surface (polyorganosiloxane compound layer) of the film 1a so that the desired ion-implanted layer is formed when the film 1a is carried from the feed out roll 3a and wound around the wind-up roll 5a. The film winding speed (line speed) is determined depending on the applied voltage, the size of the apparatus, and the like, but is normally 0.1 to 3 m/min, and preferably 0.2 to 2.5 m/min.

The pressure inside the chamber 11a is reduced by discharging air from the chamber 11a using the turbo-molecular pump 20a connected to a rotary pump. The degree of decompression is normally $1 \times 10^4$ to 1 Pa, and preferably $1 \times 10^{-3}$ to $1 \times 10^{-2}$ Pa.

An ion implantation gas (e.g., methane gas) is then introduced into the chamber 11a through the gas inlet 10a so that the chamber 11a is set an atmosphere of the ion implantation gas under reduced pressure.

Plasma is then generated using the plasma discharge electrode 4 (external electric field). The plasma may be generated by a known method using a high-frequency electric power supply (e.g., RF power supply or microwave power supply).

A negative high-voltage pulse 9a is applied from the high-voltage pulse power supply 7a connected to the high-voltage rotary can 2a through the high-voltage application terminal 15. When the negative high-voltage pulse is applied to the high-voltage rotary can 2a, ions present in the plasma are attracted, and implanted into the surface of the film around the high-voltage rotary can 2a (arrow Y in FIG. 1(a)).

The pressure during ion implantation (i.e., the pressure of plasma gas inside the chamber 11a) is preferably 0.01 to 1 Pa. The pulse width during ion implantation is preferably 1 to 15 μs. The applied voltage when applying a negative high voltage to the high-voltage rotary can 2a is preferably −1 to −50 kV.

Figure 2:
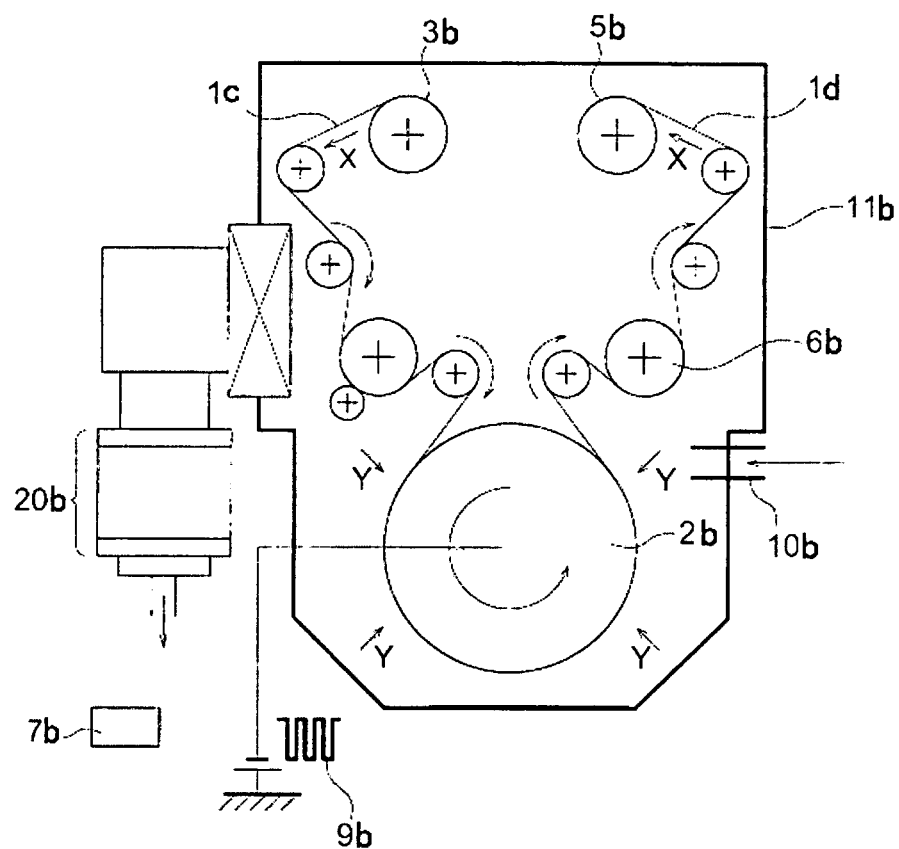
FIG. 2 is a view showing a schematic configuration of a plasma ion implantation apparatus.

A method of implanting ions into a polyorganosiloxane compound layer of a film that includes the polyorganosiloxane compound layer in its surface using a continuous plasma ion implantation apparatus shown in FIG. 2 is described below.

The apparatus shown in FIG. 2 includes the plasma ion implantation apparatus described in (δ). The plasma ion implantation apparatus generates plasma by applying an electric field due to a high-voltage pulse without using an external electric field (i.e., the plasma discharge electrode 4 shown in FIG. 1).

In the continuous plasma ion implantation apparatus shown in FIG. 2, a film 1c (film-shaped formed body) is carried in an arrow direction X shown in FIG. 2 by rotating a high-voltage rotary can 2b, and wound around a wind-up roll 5b. Note that reference sign 6b indicates a driving roll.

The continuous plasma ion implantation apparatus shown in FIG. 2 implants ions into the surface of the polyorganosiloxane compound layer included in the film as follows.

The film is placed in a chamber 11b in the same manner as the plasma ion implantation apparatus shown in FIG. 1. The pressure inside the chamber 11b is reduced by discharging air from the chamber 11b using a turbo-molecular pump 20b connected to a rotary pump. An ion implantation gas (e.g., methane gas) is introduced into the chamber 11b through a gas inlet 10b so that the chamber 11b is filled with the ion implantation gas under reduced pressure.

The pressure during ion implantation (i.e., the pressure of plasma gas inside the chamber 11b) is 10 Pa or less, preferably 0.01 to 5 Pa, and more preferably 0.01 to 1 Pa.

A high-voltage pulse 9b is applied from a high-voltage pulse power supply 7b connected to the high-voltage rotary can 2b through a high-voltage application terminal while carrying the film 1c in the direction X shown in FIG. 2.

When a negative high-voltage pulse is applied to the high-voltage rotary can 2b, plasma is generated along the film 1c positioned around the high-voltage rotary can 2b, and ions of the ion implantation gas present in plasma are attracted, and implanted into the surface of the film 1c around the high-voltage rotary can 2b (arrow Y in FIG. 2). When ions have been implanted into the surface of the polyorganosiloxane compound layer included in the film 1c, an ion-implanted layer is formed in the surface of the film. A film-shaped laminate 1d is thus obtained.

The applied voltage and the pulse width employed when applying a negative high-voltage pulse to the high-voltage rotary can 2b, and the pressure employed during ion implantation are the same as those employed when using the continuous plasma ion implantation apparatus shown in FIG. 1.

In the plasma ion implantation apparatus shown in FIG. 2, since the high-voltage pulse power supply also serves as a plasma generation means, a special means such as a high-frequency electric power supply (e.g., RF power supply or microwave power supply) is unnecessary. An ion-implanted layer can be continuously formed by implanting ions present in plasma into the surface of the polyorganosiloxane compound layer by merely applying a negative high-voltage pulse. Therefore, a formed article in which an ion-implanted layer is formed in the surface of a film can be mass-produced.

3) Electronic Device Member and Electronic Device

An electronic device member according to one embodiment of the invention includes the formed article according to one embodiment of the invention. Therefore, the electronic device member according to one embodiment of the invention exhibits an excellent gas barrier capability, so that a deterioration in the element (member) due to gas (e.g., water vapor) can be prevented. Moreover, since the electronic device member exhibits an excellent transparency, bendability, antistatic performance, and surface flatness, the electronic device member may suitably be used as a display member for liquid crystal displays and EL displays; a member for solar batteries; and the like. As a member for solar batteries, the electronic device member may also be used as a solar battery backsheet for which a gas barrier capability is desired.

An electronic device according to one embodiment of the invention includes the electronic device member according to one embodiment of the invention. Specific examples of the electronic device include a liquid crystal display, an organic EL display, an inorganic EL display, electronic paper, a solar cell, and the like.

Since the electronic device according to one embodiment of the invention includes the electronic device member that includes the formed article according to one embodiment of the invention, the electronic device exhibits an excellent gas barrier capability, transparency, bendability, antistatic performance, and surface flatness.

EXAMPLES

The invention is further described below by way of examples. Note that the invention is not limited to the following examples.

A plasma ion implantation apparatus, a water vapor transmission rate measuring apparatus, water vapor transmission rate measurement conditions, a visible light transmittance measuring apparatus, a bendability test method, a static voltage measuring apparatus, a surface resistivity measuring apparatus, and a surface flatness evaluation method used in the examples are as follows. Note that an apparatus that implants ions using an external electric field was used as the plasma ion implantation apparatus.

Plasma Ion Implantation Apparatus
RF power supply: "RF56000" manufactured by JEOL Ltd.
High-voltage pulse power supply: "PV-3-HSHV-0835" manufactured by Kurita Seisakusho Co., Ltd.
(Water Vapor Transmission Rate Measuring Apparatus)
Transmission rate tester "L89-500" manufactured by LYSSY
Measurement condition: Temperature: 40° C., relative humidity: 90%

Visible Light Transmittance Measuring Apparatus

The transmittance (wavelength: 550 nm) was measured using a ultra violet visible near infra red (UV-VIS-NIR) spectrophotometer ("UV-3600" manufactured by Shimadzu Corporation).

Bendability Test

The formed article was wound around a stainless steel rod having a diameter of 3 mm so that the side of the ion-implanted layer (the silicone release agent layer in Comparative Examples 1 and 2, the polyphenylsilsesquioxane layer in Comparative Example 3, and the silicon nitride film in Comparative Example 4) faced outside of the rod, and rotated (reciprocated) ten times in the circumferential direction. The presence or absence of cracks was then determined using an optical microscope (manufactured by Keyence Corporation) (magnification: 2000). A case where cracks were not observed is indicated by "None", and a case where cracks were observed is indicated by "Occurred".

Static Voltage Measuring Apparatus

The formed article was placed on a turntable of a charge decay measuring apparatus ("STATIC HONESTMETER Type S-5109" manufactured by Shishido Electrostatic, Ltd.) so that the side of the ion-implanted layer (the silicone release agent layer in Comparative Examples 1 and 2, the polyphenylsilsesquioxane layer in Comparative Example 3, and the silicon nitride film in Comparative Example 4) faced upward, and charged at an output voltage of 10 kV while rotating the formed article at 1300 rpm. The initial static voltage (mV), the half-life (i.e., the time required for the initial static voltage to be attenuated by 50%), and the static voltage when 60 seconds had elapsed were measured. A case where the half-life was 60 seconds or more is indicated by "60 seconds or more".

Surface Resistivity Measuring Apparatus

The surface resistivity of the ion-implanted layer (side) (the silicone release agent layer in Comparative Examples 1 and 2, the polyphenylsilsesquioxane layer in Comparative Example 3, and the silicon nitride film in Comparative Example 4) of the formed article was measured using a high resistivity meter ("Hiresta UP MCP-HT450" manufactured by Mitsubishi Chemical Corporation). A case where the surface resistivity was $1.0 \times 10^{15}$ Ω/square or more is indicated by "$1.0 \times 10^{15}$ Ω/square".

Evaluation of Surface Flatness

The surface roughness Ra (nm) (measurement area: 1×1 µm (1 µm square) and 25×25 µm (25 µm square)) of the ion-implanted layer (side) of the formed article was measured using an atomic force microscope (AFM) ("SPA300HV" manufactured by SII NanoTechnology Inc.).

Example 1

A silicone release agent 1 ("KS847" manufactured by Shin-Etsu Chemical Co., Ltd.) containing a polydimethylsiloxane as the main component (polyorganosiloxane compound) was applied to a polyethylene terephthalate film (PET film) ("PET38T-300" manufactured by Mitsubishi Plastics, Inc., thickness: 38 µm) (base). The silicone release agent was heated at 120° C. for 2 minutes to form a polydimethylsiloxane-containing layer (thickness: 100 nm) on the PET film. A formed body was thus obtained. Methane ($CH_4$) was implanted into the surface of the polydimethylsiloxane-containing layer using the plasma ion implantation apparatus shown in FIG. 1 to obtain a formed article 1.

The following plasma ion implantation conditions were used.

Duty ratio: 0.5%
Repetition frequency: 1000 Hz
Applied voltage: −10 kV
RF power supply: frequency: 13.56 MHz, applied electric power: 1000 W
Chamber internal pressure: 0.2 Pa
Pulse width: 5 µs
Processing time (ion implantation time): 5 minutes
Gas flow rate: 100 ccm Example 2

A formed article 2 was obtained in the same manner as in Example 1, except for using phenyltrimethoxysilane (manufactured by Tokyo Chemical Industry Co., Ltd., hereinafter referred to as "silicone release agent 2") as the polyorganosiloxane compound instead of the silicone release agent 1.

Example 3

A formed article 3 was obtained in the same manner as in Example 1, except for using polyphenylsilsesquioxane ("SR-23" manufactured by Konishi Chemical Inc Co., Ltd.) as the polyorganosiloxane compound instead of the silicone release agent 1.

Example 4

A formed article 4 was obtained in the same manner as in Example 1, except for using acetylene as the ion implantation gas instead of methane.

Example 5

A formed article 5 was obtained in the same manner as in Example 2, except for using acetylene as the ion implantation gas instead of methane.

Example 6

A formed article 6 was obtained in the same manner as in Example 3, except for using acetylene as the ion implantation gas instead of methane.

Example 7

A formed article 7 was obtained in the same manner as in Example 1, except for using toluene as the ion implantation gas instead of methane.

Example 8

A formed article 8 was obtained in the same manner as in Example 2, except for using toluene as the ion implantation gas instead of methane.

Example 9

A formed article 9 was obtained in the same manner as in Example 3, except for using toluene as the ion implantation gas instead of methane.

Example 10

A formed article 10 was obtained in the same manner as in Example 1, except for using ethylene as the ion implantation gas instead of methane.

Reference Example 1

A formed article 1r was obtained in the same manner as in Example 1, except for using argon as the ion implantation gas instead of methane.

Reference Example 2

A formed article 2r was obtained in the same manner as in Example 2, except for using argon as the ion implantation gas instead of methane.

Reference Example 3

A formed article 3r was obtained in the same manner as in Example 3, except for using argon as the ion implantation gas instead of methane.

Comparative Example 1

A formed article was obtained in the same manner as in Example 1, except that ion implantation was not performed. Specifically, a layer of the silicone release agent 1 was formed on the PET film to obtain a formed article 1c.

Comparative Example 2

A formed article was obtained in the same manner as in Example 2, except that ion implantation was not performed. Specifically, a layer of the silicone release agent 2 was formed on the PET film to obtain a formed article 2c.

Comparative Example 3

A formed article was obtained in the same manner as in Example 3, except that ion implantation was not performed. Specifically, a polyphenylsilsesquioxane layer was formed on the PET film to obtain a formed article 3c.

Comparative Example 4

A silicon nitride ($Si_3N_4$) film (thickness: 50 nm) was formed on a PET film by sputtering to obtain a formed article 4c.

Comparative Example 5

A formed article was obtained in the same manner as in Example 1, except that the polyorganosiloxane compound was not applied to the PET film. Specifically, methane ions were implanted into the surface of the PET film by plasma ion implantation to obtain a formed article 5c.

Comparative Example 6

A formed article was obtained in the same manner as in Example 4, except that the polyorganosiloxane compound was not applied to the PET film. Specifically, acetylene ions were implanted into the surface of the PET film by plasma ion implantation to obtain a formed article 6c.

Comparative Example 7

A formed article was obtained in the same manner as in Example 7, except that the polyorganosiloxane compound was not applied to the PET film. Specifically, toluene ions were implanted into the surface of the PET film to obtain a formed article 7c.

In Examples 1 to 10, Reference Examples 1 to 3, and Comparative Examples 5 to 7, whether or not an ion-implanted layer was formed was determined by performing elemental analysis in an area at a depth of about 10 nm from the surface using an XPS measuring apparatus (manufactured by ULVAC-PHI, Incorporated).

The water vapor transmission rate, the bendability, the visible light transmittance, the static voltage, and the surface resistivity of the formed articles 1 to 10, 1r to 3r, and 1c to 7c obtained in Examples 1 to 10, Reference Examples 1 to 3, and Comparative Examples 1 to 7 were measured. The results are shown in Table 1.

TABLE 1

| | Formed article | Water vapor transmission rate (g/m²/day) | Presence or absence of cracks due to bendability test | Visible light transmittance (%) | Static voltage Initial value (mV) | Half-life (s) | After 1 minute (mV) | Surface resistivity (Ω/square) |
|---|---|---|---|---|---|---|---|---|
| Example 1 | 1 | 0.38 | None | 88.3 | 1.9 | 60 sec or more | 1.9 | $1.01 \times 10^{14}$ |
| Example 2 | 2 | 2.80 | None | 84.1 | 1.9 | 60 sec or more | 1.9 | $8.51 \times 10^{12}$ |
| Example 3 | 3 | 0.15 | None | 80.3 | 1.9 | 60 sec or more | 1.9 | $1.02 \times 10^{14}$ |
| Example 4 | 4 | 0.35 | None | 75.5 | 0.8 | 3 | 0.0 | $6.59 \times 10^{10}$ |
| Example 5 | 5 | 1.50 | None | 75.7 | 0.6 | 3 | 0.0 | $4.23 \times 10^{10}$ |
| Example 6 | 6 | 0.16 | None | 74.1 | 0.6 | 3 | 0.0 | $4.64 \times 10^{10}$ |
| Example 7 | 7 | 1.22 | None | 55.6 | 1.8 | 30 | 0.0 | $9.86 \times 10^{11}$ |
| Example 8 | 8 | 1.15 | None | 57.9 | 1.8 | 45 | 0.0 | $8.48 \times 10^{11}$ |
| Example 9 | 9 | 1.13 | None | 59.2 | 1.8 | 30 | 0.0 | $7.64 \times 10^{11}$ |
| Example 10 | 10 | 0.60 | None | 78.2 | 0.8 | 4 | 0.0 | $7.03 \times 10^{10}$ |
| Reference Example 1 | 1r | 0.72 | None | 90.4 | 2.0 | 60 sec or more | 2.0 | $4.96 \times 10^{13}$ |
| Reference Example 2 | 2r | 2.50 | None | 86.9 | 2.0 | 60 sec or more | 2.0 | $3.21 \times 10^{14}$ |
| Reference Example 3 | 3r | 0.40 | None | 82.7 | 2.0 | 60 sec or more | 2.0 | $1.0 \times 10^{15}$ or more |
| Comparative Example 1 | 1c | 12.31 | None | 92.4 | 2.0 | 60 sec or more | 2.0 | $1.0 \times 10^{15}$ or more |
| Comparative Example 2 | 2c | 11.60 | None | 90.9 | 2.0 | 60 sec or more | 2.0 | $1.0 \times 10^{15}$ or more |
| Comparative Example 3 | 3c | 12.50 | None | 89.3 | 2.0 | 60 sec or more | 2.0 | $1.0 \times 10^{15}$ or more |
| Comparative Example 4 | 4c | 0.43 | Occurred | 82.3 | 2.0 | 60 sec or more | 2.0 | $7.55 \times 10^{14}$ |

TABLE 1-continued

| | Formed article | Water vapor transmission rate (g/m²/day) | Presence or absence of cracks due to bendability test | Visible light transmittance (%) | Static voltage Initial value (mV) | Static voltage Half-life (s) | After 1 minute (mV) | Surface resistivity (Ω/square) |
|---|---|---|---|---|---|---|---|---|
| Comparative Example 5 | 5c | 11.90 | None | 83.0 | 2.0 | 60 sec or more | 2.0 | $1.20 \times 10^{14}$ |
| Comparative Example 6 | 6c | 11.80 | None | 74.2 | 0.7 | 3 | 0.0 | $5.76 \times 10^{10}$ |
| Comparative Example 7 | 7c | 12.00 | None | 56.3 | 1.8 | 40 | 0.0 | $9.23 \times 10^{11}$ |

The formed articles 1 to 10, 1r to 3r, and 1c to 7c obtained in Examples 1 to 10, Reference Examples 1 to 3, and Comparative Examples 1 to 7 were also subjected to the surface flatness evaluation test. The results are shown in Table 2.

TABLE 2

| | Formed article | Ra (nm) (1 μm square) | Ra (nm) (25 μm square) |
|---|---|---|---|
| Example 1 | 1 | 0.22 | 1.28 |
| Example 2 | 2 | 0.30 | 1.52 |
| Example 3 | 3 | 0.21 | 1.32 |
| Example 4 | 4 | 0.25 | 1.98 |
| Example 5 | 5 | 0.34 | 2.39 |
| Example 6 | 6 | 0.22 | 1.87 |
| Example 7 | 7 | 0.27 | 1.45 |
| Example 8 | 8 | 0.32 | 1.55 |
| Example 9 | 9 | 0.24 | 1.39 |
| Example 10 | 10 | 0.30 | 2.20 |
| Reference Example 1 | 1r | 0.21 | 1.32 |
| Reference Example 2 | 2r | 0.28 | 1.62 |
| Reference Example 3 | 3r | 0.20 | 1.37 |
| Comparative Example 1 | 1c | 1.17 | 3.91 |
| Comparative Example 2 | 2c | 1.34 | 4.02 |
| Comparative Example 3 | 3c | 1.26 | 3.75 |
| Comparative Example 4 | 4c | 1.60 | 13.2 |
| Comparative Example 5 | 5c | 0.38 | 14.5 |
| Comparative Example 6 | 6c | 0.36 | 15.3 |
| Comparative Example 7 | 7c | 0.46 | 17.5 |

As shown in Table 1, the formed articles 1 to 10 obtained in Examples 1 to 10 had a low water vapor transmission rate (i.e., excellent gas barrier capability) as compared with the formed articles 1c to 3c and 5c to 7c obtained in Comparative Examples 1 to 3 and 5 to 7. The formed articles 4 to 10 obtained in Examples 4 to 10 had a low static voltage and surface resistivity (i.e., excellent antistatic performance) as compared with the formed articles 1c to 5c obtained in Comparative Examples 1 to 5.

The formed articles obtained in Examples 1 to 10 did not produce cracks during the bendability test, and exhibited excellent bendability as compared with the formed article 4c obtained in Comparative Example 4 in which the inorganic film was formed.

As shown in Table 2, the formed articles 1 to 10 obtained in Examples 1 to 10 exhibited excellent surface flatness as compared with the formed articles 1c to 7c obtained in Comparative Examples 1 to 7.

It was thus confirmed that a formed article that exhibits an excellent gas barrier capability, transparency, antistatic performance, bendability, and surface flatness can be obtained by implanting ions of a hydrocarbon compound under appropriate conditions.

LIST OF REFERENCE SYMBOLS 1a, 1c: film-shaped formed body, 1b, 1d: film-shaped formed article, 2a, 2b: rotary can, 3a, 3b: feed out roll, 4: plasma discharge electrode, 5a, 5b: wind-up roll, 6a, 6b: driving roll, 7a, 7b: pulse power supply, 9a, 9b: high-voltage pulse, 10a, 10b: gas inlet, 11a, 11b: chamber

The invention claimed is:

1. A method of producing a formed article having a base and a layer formed on the base and obtained by implanting ions of a hydrocarbon compound into a polyorganosiloxane compound-containing layer, the base being formed of a material selected from the group consisting of polyimides, polyamides, polyamideimides, polyphenylene ethers, polyether ketones, polyether ether ketones, polyolefins, polyesters, polycarbonates, polysulfones, polyether sulfones, polyphenylene sulfides, polyallylates, acrylic resins, cycloolefin polymers, and aromatic polymers, the method comprising implanting ions of a hydrocarbon compound into a surface of a polyorganosiloxane compound-containing layer of a formed body that includes the polyorganosiloxane compound-containing layer in its surface, wherein the hydrocarbon compound is selected from the group consisting of an alkene gas, an alkadiene gas, an alkyne gas, a cycloalkane gas and a cycloalkane gas, wherein the formed article has a low water vapor transmission rate of 0.15 to 2.80 g/m2/day, wherein the main chain structure of the polyorganosiloxane compound is a straight chain structure shown by the following formula (a), a ladder-like structure shown by the following formula (b), or a polyhedral structure shown by the following formula (c),

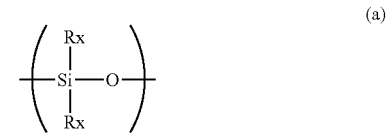

(a)

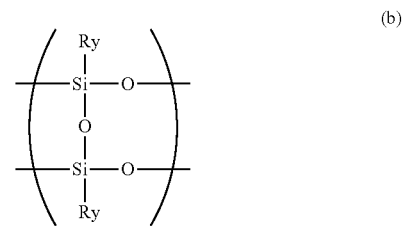

(b)

-continued

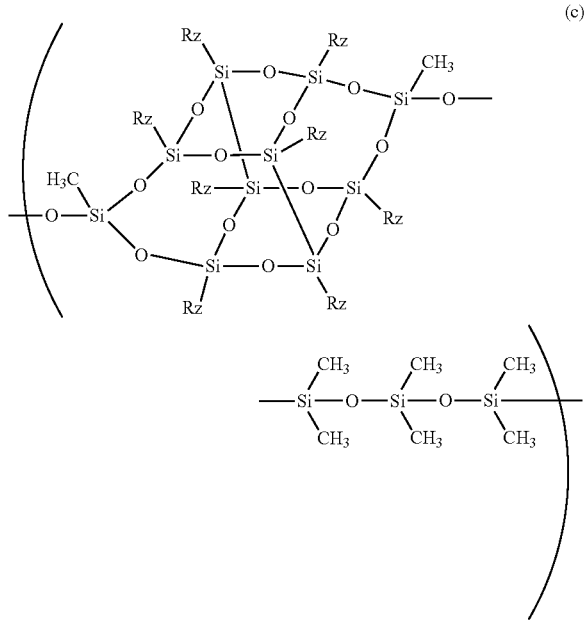

(c)

wherein Rx, Ry, and Rz individually represent a hydrogen atom, a non-hydrolysable group selected from the group consisting of a substituted alkyl group whose substituent is halogen atoms, a hydroxyl group, a thiol group, an epoxy group, a glycidoxy group, an unsubstituted phenyl groups, a substituted alkenyl group whose substituent is halogen atoms, a hydroxyl group, a thiol group, an epoxy group, a glycidoxy group, or an unsubstituted phenyl groups; an unsubstituted alkenyl group; a substituted aryl group whose substituent is halogen atoms, alkyl groups having 1 to 6 carbon atoms, alkoxy groups having 1 to 6 carbon atoms, a nitro group, a cyano group, a hydroxyl group, a thiol group, an epoxy group and a glycidoxy group, provided that a case where both Rx in the formula (a) represent a hydrogen atom is excluded.

2. The method according to claim 1, comprising implanting ions of the hydrocarbon compound into a polyorganosiloxane compound-containing layer while carrying a formed body that includes the polyorganosiloxane compound-containing layer in its surface in a given direction, wherein the hydrocarbon compound is selected from the group consisting of an alkene gas, an alkadiene gas, an alkyne gas, a cycloalkane gas and a cycloalkane gas.

3. The method according to claim 1, wherein the content of the polyorganosiloxane compounds in the polyorganosiloxane compound-containing layer is 70 wt % or more.

4. The method according to claim 1, wherein the formed article produced has a water vapor transmission rate of 1.5 g/m²/day or less at a temperature of 40° C. and a relative humidity of 90%.

5. The method according to claim 1, wherein the formed article produced has a surface resistivity of $1.1 \times 10^{14}$ Ω/square or less.

* * * * *